United States Patent
Azuma

(10) Patent No.: US 8,826,194 B2
(45) Date of Patent: Sep. 2, 2014

(54) PATTERN DATA GENERATING APPARATUS

(75) Inventor: Teukasa Azuma, Kawasaski (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 13/368,196

(22) Filed: Feb. 7, 2012

(65) Prior Publication Data

US 2012/0220136 A1   Aug. 30, 2012

(30) Foreign Application Priority Data

Feb. 25, 2011   (JP) ................. 2011-040090

(51) Int. Cl.
G06F 17/50   (2006.01)
H01L 21/033  (2006.01)

(52) U.S. Cl.
CPC .................. *H01L 21/0337* (2013.01)
USPC .......................................................... 716/55

(58) Field of Classification Search
CPC ............ G06F 17/5068; G06F 17/5081; G06F 2217/12; G03F 71/144; G03F 1/36; G03F 7/705; H01L 21/0337
USPC ..................................... 716/50, 55
See application file for complete search history.

(56) References Cited

U.S. PATENT DOCUMENTS

2011/0209106 A1*   8/2011   Cheng et al. .................... 716/55

FOREIGN PATENT DOCUMENTS

| JP | 2008-36491 | 2/2008 |
|---|---|---|
| JP | 2008-243993 | 10/2008 |
| WO | WO 2006/035859 A1 | 4/2006 |

* cited by examiner

*Primary Examiner* — Vuthe Siek
(74) *Attorney, Agent, or Firm* — Finnegan, Henderson, Farabow, Garrett & Dunner, L.L.P.

(57) ABSTRACT

According to one embodiment, a pattern data generating apparatus comprises a storage unit that stores a table defining direct self assembly information that combines a direct self assembly material, a film thickness of the direct self assembly material, and a process condition for the direct self assembly material according to a pattern dimension, a division unit that divides layout data of a device based on the pattern dimension to generate divided layouts, an extraction unit that extracts the direct self assembly information corresponding to the pattern dimension of the divided layout from the table, and a generation unit that generates pattern data by allocating the direct self assembly information extracted by the extraction unit to the divided layouts.

2 Claims, 6 Drawing Sheets

122

| | d1 | d2 | d3 | |
|---|---|---|---|---|
| DIMENSION (HALF PITCH) | 15nm | 25nm | 35nm | ... |
| DSA MATERIAL | PS—PMMA | PS—PMMA | PS—PMMA | ... |
| MOLECULAR WEIGHT | 20000-20000 | 50000-50000 | 150000-150000 | |
| FILM THICKNESS | 40nm | 70nm | 100nm | ... |
| PROCESS CONDITION | ANNEALING AT 230°C FOR 5 MINUTES | ANNEALING AT 250°C FOR 5 MINUTES | ANNEALING AT 240°C FOR 15 MINUTES | ... |
| SAM | p—CHLORO PHENYL TRIMETHOXYSILANE | p—CHLORO PHENYL TRIMETHOXYSILANE | p—CHLORO PHENYL TRIMETHOXYSILANE | ... |

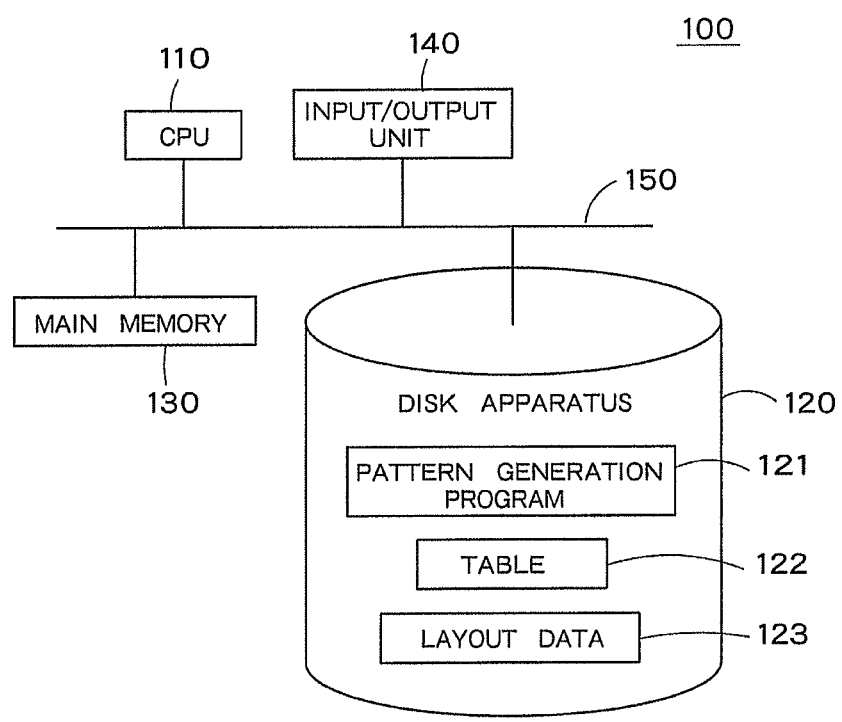
F I G. 1

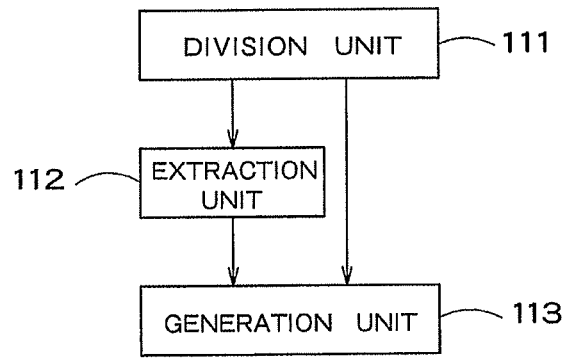
F I G. 4
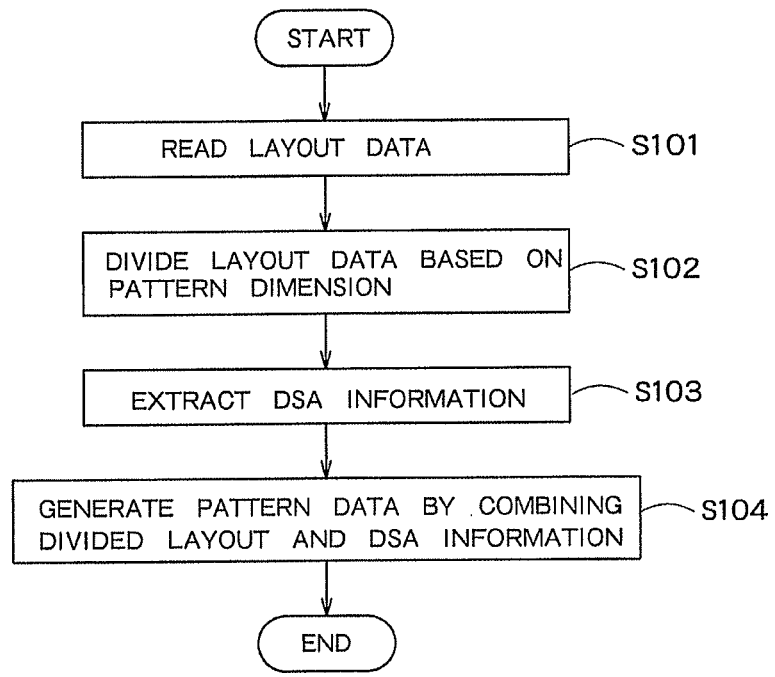
F I G. 5

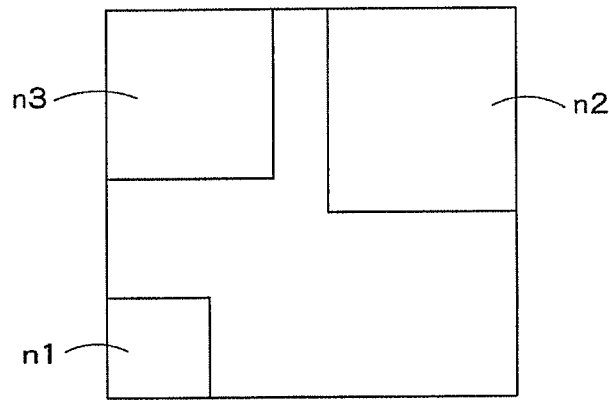
F I G. 6
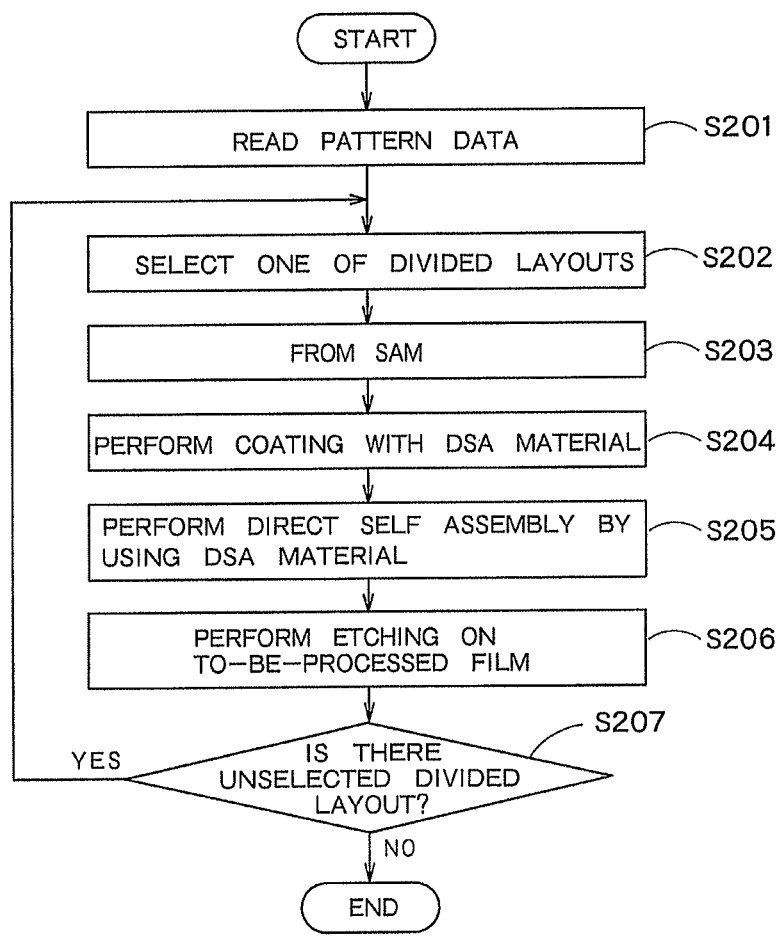
F I G. 7

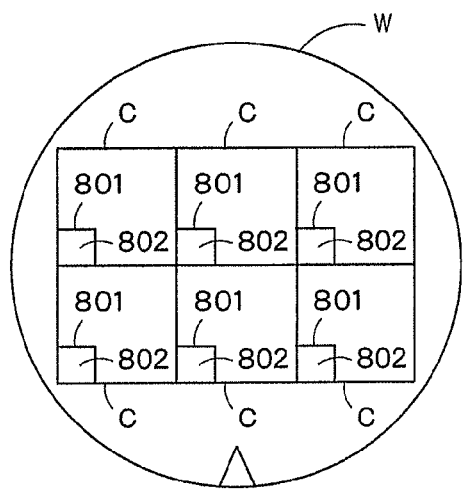
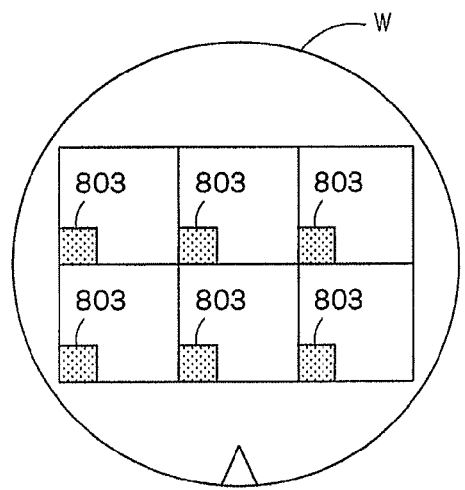
F I G. 8A          F I G. 8B
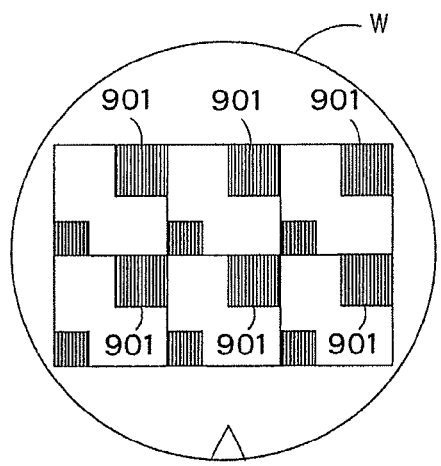
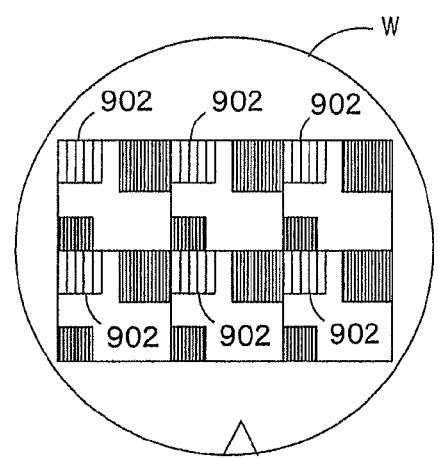
F I G. 9A          F I G. 9B

PATTERN DATA GENERATING APPARATUS

CROSS REFERENCE TO RELATED APPLICATION

This application is based upon and claims benefit of priority from the Japanese Patent Application No. 2011-40090, filed on Feb. 25, 2011, the entire contents of which are incorporated herein by reference.

FIELD

Embodiments described herein relate generally to a pattern data generating apparatus, a pattern data generating method, and a pattern forming method.

BACKGROUND

Recently, as semiconductor devices are miniaturized, an EUV exposure apparatus or an ArF immersion exposure apparatus has been used for a lithography process for formation of fine patterns, and thus the cost has increased. As a well-known technique for forming fine patterns at low costs, there is a technique using a direct self assembly material of a block copolymer. A semiconductor device includes various patterns of different sizes or shapes. Therefore, it is necessary to form these patterns by using a direct self assembly material.

BRIEF DESCRIPTION OF THE DRAWINGS

FIG. 1 is a diagram illustrating a hardware structure of a pattern data generating apparatus according to an embodiment of the present invention;

FIG. 4 is a functional block diagram illustrating functional blocks embodied by execution of a pattern data generating program;

FIG. 5 is a flowchart illustrating a pattern data generating method according to the embodiment;

FIG. 6 is a diagram illustrating an example of a divided layout;

FIG. 7 is a flowchart illustrating a pattern forming method according to the embodiment;

FIGS. 8A and 8B are diagrams illustrating processes in the pattern forming method according to the embodiment; and FIGS. 9A and 9B are diagrams illustrating processes following the processes in FIGS. 8A and 8B.

DETAILED DESCRIPTION

Figure 2:
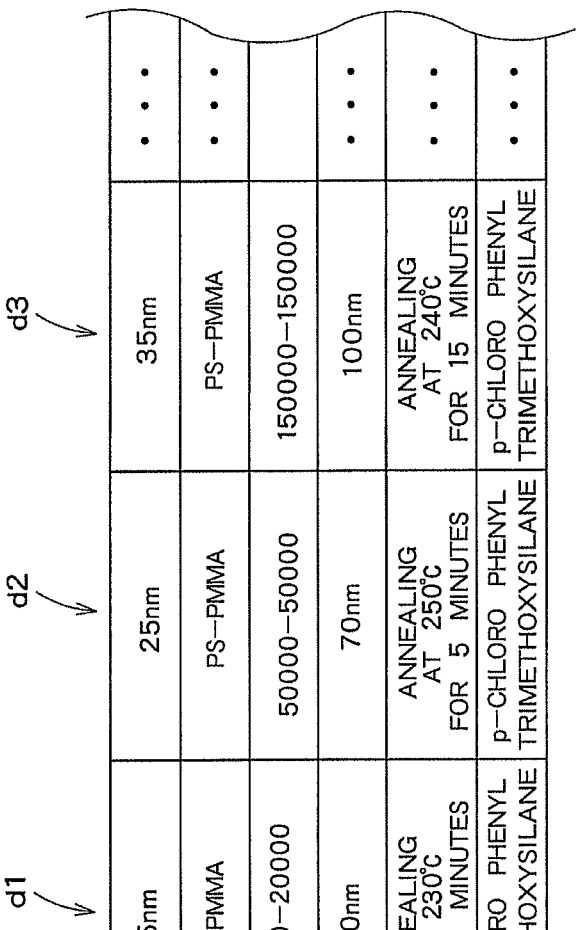
FIG. 2 is a diagram illustrating an example of DSA information which is defined in a table.

According to one embodiment, a pattern data generating apparatus comprises a storage unit that stores a table defining direct self assembly information that combines a direct self assembly material, a film thickness of the direct self assembly material, and a process condition for the direct self assembly material according to a pattern dimension, a division unit that divides layout data of a device based on the pattern dimension to generate divided layouts, an extraction unit that extracts the direct self assembly information corresponding to the pattern dimension of the divided layout from the table, and a generation unit that generates pattern data by allocating the direct self assembly information extracted by the extraction unit to the divided layouts.

Embodiments will now be explained with reference to the accompanying drawings.

FIG. 1 illustrates a hardware structure of a pattern data generating apparatus according to an embodiment of the present invention. The pattern data generating apparatus 100 includes a central processing unit (CPU) 110, a disk apparatus 120, a main memory 130, and an input/output unit 140. Components of the pattern data generating apparatus 100 are connected to each other via a bus 150.

The disk apparatus 120 stores the pattern data generating program 121 to be executed by the CPU 110. In addition, as illustrated in FIG. 2, the disk apparatus 120 stores a table 122 listing direct self assembly (hereinafter, referred to as a DSA) information, which includes a DSA material, a molecular weight, a film thickness, a process condition, and a self assembled monolayer (hereinafter, referred to as an SAM), according to a pattern dimension.

Figure 3:
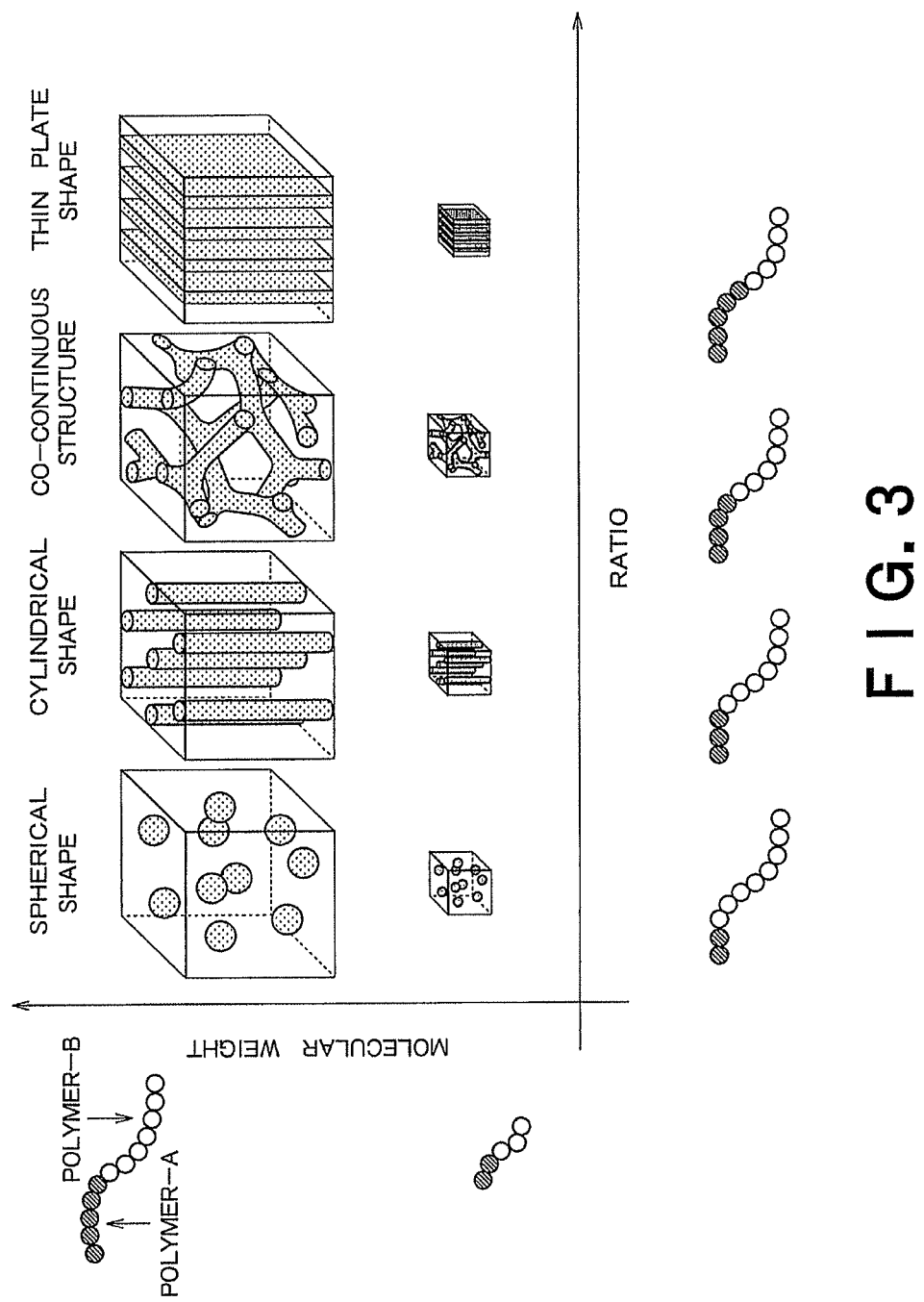
FIG. 3 is a diagram illustrating a relation of a molecular weight, a ratio, and a formed structure of DSA materials.

For example, as illustrated in FIG. 3, if the molecular weights of a polymer A and a polymer B constituting the DSA material are changed, a size of a pattern formed with the DSA material is changed. In addition, if the ratio of the polymer A and the polymer B constituting the DSA material is changed, the structure of the pattern formed with the DSA material is changed.

In addition, the size of the pattern formed with the DSA material is also changed according to the film thickness of the coated DSA material or according to the process condition with respect the DSA material during the direct self assembly process. In addition, the SAM appropriate for a bottom layer is different according the type of DSA material.

In other words, the table 122 is configured to define the DSA information combining a DSA material (material name or molecular weight), a film thickness of the DSA material, a process condition for the DSA material, and an SAM which becomes the bottom layer of the DSA material, which are required to form a pattern having a desired dimension.

For example, in the case where a line-and-space pattern having a half pitch of 15 nm is formed from the table 122 illustrated in FIG. 2, the SAM which is the bottom layer may be formed by using p-chloro phenyl trimethoxysilane; a coating process of PS (polystyrene)-PMMA (polymethyl methacrylate) (molecular weight: 20000-20000) may be performed with a thickness of 40 nm; and after that, an annealing process may be performed at 230° C. for 5 minutes.

In addition, the disk apparatus 120 stores layout data 123 of a semiconductor device (in a GDS format) which is designed in advance. A semiconductor device is configured to include a plurality of layers, so that the layout data 123 includes layout data corresponding to each layer.

The disk apparatus 120 is, for example, a hard disk. In addition, the pattern data generating program 121 may be stored in a ROM (not illustrated) or a magnetic tape (not illustrated) rather than the disk apparatus 120.

The CPU 110 loads the pattern data generating program 121 stored in the disk apparatus 120 on the main memory 130 to execute the pattern data generating program 121. At this time, the table 122 stored in the disk apparatus 120 may be configured to be loaded on the main memory 130. According to the execution of the pattern data generating program 121, an area which stores divided layouts which are formed by dividing the layout data according to a pattern dimension is secured on the main memory 130.

FIG. 4 illustrates a functional block diagram embodied by allowing the CPU 110 to execute the pattern data generating program 121. A division unit 111, an extraction unit 112, and a generation unit 113 are embodied by execution of the pattern data generating program 121.

The processes performed in the division unit 111, the extraction unit 112, and the generation unit 113 are described with reference to a flowchart illustrated in FIG. 5.

In Step S101, the layout data is read. The layout data 123 is configured with layout data corresponding to a plurality of layers. In this case, layout data corresponding to one of the layers is read.

In Step S102, the division unit 111 divides the layout data based on the pattern dimension. The divided layout data is stored as the divided layouts in the main memory 130.

For example, as illustrated in FIG. 6, in the case where layout data of one chip includes an area n1 configured with a line-and-space pattern having a half pitch of 15 nm, an area n2 configured with a line-and-space pattern having a half pitch of 25 nm, and an area n3 configured with a line-and-space pattern having a half pitch of 35 nm, the division unit 111 divides the areas n1, n2, and n3 as the divided layouts n1, n2, and n3, respectively.

In Step S103, the extraction unit 112 extracts the DSA information corresponding to the pattern dimensions of the divided layouts divided in Step S102 from the table 122.

For example, in the case where the divided layouts n1, n2, and n3 are generated in Step S102 as illustrated in FIG. 6, the extraction unit 112 extracts the DSA information d1, d2, and d3 from the table 122 illustrated in FIG. 2 based on the pattern dimensions of the divided layouts n1, n2, and n3.

In Step S104, the generation unit 113 generates the pattern data by combining the divided layouts divided by the division unit 111 in Step S102 with the DSA information extracted from the table 122 by the extraction unit 112 in Step S103.

For example, the generation unit 113 generates the pattern data by combining the divided layout n1 with the DSA information d1, combining the divided layout n2 with the DSA information d2, and combining the divided layout n3 with the DSA information d3.

The pattern data generated by the generation unit 113 is stored in the disk apparatus 120 and outputs through the input/output unit 140 to an external apparatus.

Next, a method of forming a pattern on a substrate by using the pattern data will be described with reference to a flowchart illustrated in FIG. 7.

In Step S201, the pattern data is read by an apparatus used for forming the pattern, for example, an apparatus for coating of a DSA material, a baker, or the like.

In Step S202, one divided layout is selected. As described above, the layout data is configured to be divided into a plurality of the divided layouts based on the pattern dimension, and in this step, one layout is selected among a plurality of the divided layouts.

In the following Steps S203 to S205, DSA information will be used which may be combined with the divided layout selected in this step.

In Step S203, the SAM is formed on the to-be-processed film based on the DSA information. After the formation of the SAM, a surface reforming process using exposure light may be performed. For example, after the formation of the SAM, the surface is exposed to light, and the exposed portion is reformed from a hydrophobic property to a hydrophilic property, so that the DSA material is easily formed.

In Step S204, the coating of the DSA material is performed based on the DSA information.

In Step S205, a direct self assembling process is performed by applying energy to the DSA material through baking or the like based on the DSA information (in other words, molecules are spontaneously collected). As a result, a structure of the DSA material is changed, so that the material have a thin plate shape or a cylindrical shape as illustrated in FIG. 3.

In Step S206, the to-be-processed film is etched by using the DSA material of which the structure is changed as a mask.

In Step S207, if there is an unselected divided layout, the process returns to Step S202.

For example, in the case where the pattern is formed by using the pattern data combining the divided layout n1 with the DSA information d1, combining the divided layout n2 with the DSA information d2, and combining the divided layout n3 with the DSA information d3, first, the divided layout n1 is selected, and the process is performed by using the DSA information d1.

As illustrated in FIG. 8A, a plurality of chips C is disposed on a wafer W, and a SAM 802 defined by the DSA information d1 is formed on an area 801 corresponding to the divided layout n1 of each chip C. Next, as illustrated in FIG. 8B, the SAM 802 is coated with a DSA material 803 defined by the DSA information d1.

Subsequently, baking or the like is performed based on the process condition defined by the DSA information d1, so that the DSA material 803 is direct-self-assembled. Next, a to-be-processed film is etched by using the DSA material 803 as a mask, so that a desired pattern is formed on the to-be-processed film.

Next, as illustrated in FIG. 9A, in the area 901 corresponding to the divided layout n2, the coating of the DSA material, the baking, and the like are performed based on the DSA information d2, and the to-be-processed film is etched by using the DSA material as a mask, so that the to-be-processed film is processed to have a desired pattern shape.

Subsequently, as illustrated in FIG. 9B, in the area 902 corresponding to the divided layout n3, the coating of the DSA material, the baking, and the like are performed based on the DSA information d3, and the to-be-processed film is etched by using the DSA material as a mask, so that the to-be-processed film is processed to have a desired pattern shape. According to this process, several types of patterns having different dimensions may be formed on the wafer by using the DSA material.

In this manner, in the embodiment, prepared is DSA information combining a DSA material, a film thickness of the DSA material, a process condition, and an SAM which becomes a bottom layer of the DSA material, which are required to form a pattern having a desired dimension, and the DSA information according to the pattern dimension is allocated to a designed layout pattern of a semiconductor device. Next, the pattern is formed by using the DSA material based on the allocated DSA information. Therefore, it is possible to form various fine patterns by using the DSA (Direct Self Assembly) material.

In the embodiment, although the table 122 defines the DSA information on the line-and-space pattern, the table may define DSA information on a pattern having a different shape such as a hole.

In the embodiment, the DSA information may not include information on the SAM which becomes a bottom layer of the DSA material.

In addition, the division may be performed on only the fine pattern, of which the dimension is equal to or less than a predetermined value, among the layout data 123 of the semiconductor device, and the pattern data may be generated by allocating the DSA information.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pattern data generating apparatus comprising:
    a storage unit that stores a table defining direct self-assembly information that combines:
        a direct self-assembly material,
        a film thickness of the direct self-assembly material,
        a process condition for the direct self-assembly material according to a pattern dimension, and
        a self-assembled monolayer which forms a base layer for the direct self-assembly material;
    a division unit that divides layout data of a device based on the pattern dimension to generate divided layouts;
    an extraction unit that extracts the direct self-assembly information corresponding to the pattern dimension of the divided layout from the table; and
    a generation unit that generates pattern data by allocating the direct self-assembly information extracted by the extraction unit to the divided layouts.

2. The pattern data generating apparatus according to claim 1, wherein the division unit produces the divided layout for an area where the pattern dimension is equal to or less than a predetermined value.

\* \* \* \* \*